United States Patent
Tsai et al.

(10) Patent No.: US 7,479,237 B2
(45) Date of Patent: Jan. 20, 2009

(54) METHOD OF FABRICATING VERTICAL PROBE HEAD

(75) Inventors: Jiu-Shu Tsai, Taipei (TW); Min-Chieh Chou, Taipei (TW); Fuh-Yu Chang, Zhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 268 days.

(21) Appl. No.: 11/641,880

(22) Filed: Dec. 20, 2006

(65) Prior Publication Data

US 2007/0167022 A1 Jul. 19, 2007

(30) Foreign Application Priority Data

Dec. 30, 2005 (TW) .............................. 94147678 A

(51) Int. Cl.
*B44C 1/22* (2006.01)
(52) U.S. Cl. .............................. 216/67; 216/58; 29/825; 29/593; 29/592.1; 324/718; 324/719; 324/724
(58) Field of Classification Search .................. 216/67; 250/306; 29/825
See application file for complete search history.

(56) References Cited

U.S. PATENT DOCUMENTS

| 4,027,935 A | 6/1977 | Byrnes et al. ................ 439/289 |
| 6,246,054 B1 * | 6/2001 | Toda et al. ................... 250/306 |
| 6,906,540 B2 | 6/2005 | McQuade et al. ........... 324/754 |
| 6,927,586 B2 | 8/2005 | Thiessen ...................... 324/754 |

FOREIGN PATENT DOCUMENTS

TW 569017 1/2004

* cited by examiner

*Primary Examiner*—Nadine Norton
*Assistant Examiner*—Maki Angadi
(74) *Attorney, Agent, or Firm*—WPAT., P.C.; Justin King

(57) ABSTRACT

The present invention relates to a method of fabricating a vertical probe head, whereas the vertical probe head is formed by the combination of at least a probe, a bottom guide plate and a top guide plate having at least a hole matching the probe. The probe is fabricated by a LIGA-like process combining with the processes of photolithography, etching and electroforming, and so on, so that the probe is equipped with comparatively better precision, strength and reliability and yet can be custom-made for satisfying various demands. In addition, both the top and bottom guide plates are made by a means of non-mechanical machining, which respectively is fabricated by processing a substrate using means of photolithography, etching and mask so as to fabricate holes for matching with the aforesaid probe. The vertical probe head of the invention is a breakthrough over the current probe head and thus breaks the bottleneck limiting the process of fabricating the same, such that the method disclosed in the invention enables the probe head to be fabricated by a cheaper and less complicated process with more probes to be arranged in a unit area.

20 Claims, 8 Drawing Sheets

METHOD OF FABRICATING VERTICAL PROBE HEAD

FIELD OF THE INVENTION

The present invention relates to a method of fabricating a probe, and more particularly, to a method of fabricating a vertical probe head capable of utilizing a LIGA-like process to fabricate a probe head with curve or polygonal profile, while utilizing a non-mechanical process to manufacture a guide plate having at least a hole with curve or polygonal profile.

BACKGROUND OF THE INVENTION

The probe card is a tool for testing semiconductors used at "Wafer Test" to check quality of IC or LSI in the first process of semiconductor manufacturing. In the manufacturing process of semiconductors such as IC and LSI, "Wafer Test" utilizing probe cards is performed to check quality of IC chips, so that the process yield can be increased effectively since defects can be screened to be repaired or discarded. Generally, a good probe card can raise yield of a semiconductor manufacturing process for about 20% and thereby reduce the cost thereof.

As semiconductor manufacturers continue to shrink die geometries, which makes the task of on-wafer testing increasingly more difficult, probe card with innovative solutions are required to meet the semiconductor industry's test needs so as to ensure higher accuracy and repeatable wafer testing and thus increase yield. According to an investigation made by VLSI Research, Inc, as the recovery of probe card industry following the revive of world economy, the revenue growth of the probe card industry surpasses that of the semiconductor industry in Year 2004, that its celebrated with a 42% growth with annual revenue as high as 683.6 million U.S. dollars. Moreover, as the popularization of flip chip package process, the compound annual growth rate of gold bump and solder bump is 25% and higher that it is anticipated that the needs for vertical probe is going to increase year by year.

The vertical probe head currently used is originated from a manufacturing process disclosed at 1997 in U.S. Pat. No. 4,027,925, wherein a vertical probe head disclosed has each of it's probes buckle or deflect when a predetermined axial load is applied thereto for enabling the same force to be exerted on each of a plurality of pads on a semiconductor chip as it is being tested. Moreover, each guide plate of such vertical head is processed by a mechanical drilling means for forming holes thereon while enabling each hole to be formed at a position corresponding to a pad to be tested on the semiconductor, such that a probe head can be completed as each hole is fitted with a probe manually. However, it is noted that the probes of the aforesaid manufacturing process require to be process by a one-by-one manner that is, not only time-consuming, but also the geometrical shape an the precision of each probe are limited as the cross-section of each probe is a circular shape. Furthermore, as the holes used to receive and fix probe of the guide plate are formed by a mechanical drilling means, the pitches between holes can not satisfy the precision requirement of smaller than 120 μm.

Further, as the techniques disclosed in U.S. Pat. Nos. 6,927,586 and 6,906,540, a probe having various geometrical-shaped cross-sections is manufactured by a means of chemical etching. However, the material that can be used to make such probe is limited to be Beryllium Copper (BeCu). Moreover, the holes used to receive and fix probe of the guide plate are still formed by a mechanical process so that the number of probes to be arranged on a unit area can not increase since the pitches still can not be reduced.

In addition, In T.W. Pat. No. 569017, entitled "a vertical probe card with force feedback", a method of utilizing a MEMS (micro-electro-mechanical system) process to manufacture multi-layer probes is disclosed. Although the method of manufacturing multi-layer probes is advantageous mass production, the precision of probes formed thereby are reduced since the error of flatness of each layer is accumulated to the next layer firmed successively thereafter as the multi-layer probes are formed by a process of stacking a layer on top of another. It is noted that the accumulated error is going to adversely affect the assembly of such multi-layer probes to its guide plate as the holes are not aligned properly, and thus affect a test precision as it is being used to test a semiconductor chip.

Therefore, it is in need of a novel vertical probe head capable of overcoming the shortcomings of those prior-art probes.

SUMMARY OF THE INVENTION

It is the primary object of the present invention to provide a method of fabricating a vertical probe head, which utilizes a LIGA-like process to fabricate a probe head with curve or polygonal profile, while utilizing a non-mechanical process to manufacture a guide plate, such not only the cost of the probe head can be reduced since the method enables the probe head to be batch produced, but also the processing precision of the probe head can be increased.

In a preferred aspect, to achieve the above object, the present invention provides a method of fabricating a vertical probe head, which comprises the steps of:

providing a substrate;

overlaying a mask on the substrate for defining at least an area;

removing a portion of the substrate within each defined area;

removing the mask while depositing a seed layer on the substrate;

depositing a metal layer on the seed layer by a means of electroforming deposition;

polishing the metal layer; and removing the substrate while forming at least a micro probe, comprised of a first probe, a second probe, and an elastic member sandwiched between the first and the second probes while connecting thereto.

Preferably, the cross-section of the micro probe is a shape selected from a polygon, a geometrical shape with rounded angle and a geometrical shape with arc outline.

Preferably, the substrate is made of silicon or silicon compound.

Preferably, the removing of the portion of the substrate is performed by a means of reactive ion etching (RIE).

Preferably, the metal layer is made of a material selected from the group consisting of nickel, gold, silver, copper, nickel alloy, gold alloy, copper alloy and silver alloy.

Moreover, the present invention further provides a method of fabricating a guide plate adapted for, vertical probe heads, which comprises the steps of:

providing a substrate;

overlaying a mask on the substrate for defining at least an area of through holes utilizing a lithographic process;

performing an anisotropic etching upon each defined area for enabling at least a through hole to be formed therein;

removing the mask so as to form a guide plate having at least a through hole; and insulating the guide plate.

In another preferred aspect, to achieve the above object, the present invention further, provides a method of fabricating a vertical probe head, comprising the steps of:

provide a substrate;

overlaying a mask on the substrate for defining at least an area;

removing a portion of the substrate within each defined area;

removing the mask while depositing a seed layer on the substrate;

depositing a metal layer on the seed layer by a means of electroforming deposition;

polishing the metal layer;

removing the substrate while forming at least a micro probe; and combining each micro probe with a guide plate having at least a through hole.

Preferably, the profile of the through hole is a shape selected from a polygon, a geometrical shape with rounded angle and a geometrical shape with arc outline.

Moreover, the present invention further provides a method of fabricating a guide plate adapted for vertical probe heads, which comprises the steps of:

providing a substrate;

overlaying a mask on the substrate for defining at least an area of through holes utilizing a lithographic process;

performing an anisotropic etching upon each defined area for enabling at least a through hole to be formed therein; and removing the mask so as to form a guide plate having at least a through hole Preferably, the method of fabricating a guide plate adapted for vertical probe heads further comprises a step of:

insulating the guides plate.

Other aspects and advantages of the present invention will become apparent from, the following detailed description, taken in conjunction with the accompanying drawings, illustrating by way of example the principles of the present invention.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 1A:
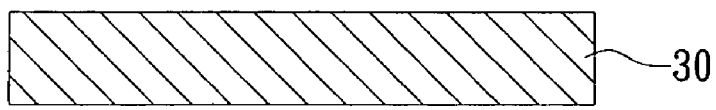
FIG. 1A~FIG. 1G are schematic diagrams showing successive steps of a method of fabricating a vertical probe head according to a preferred embodiment of the present invention.
Figure 1B:
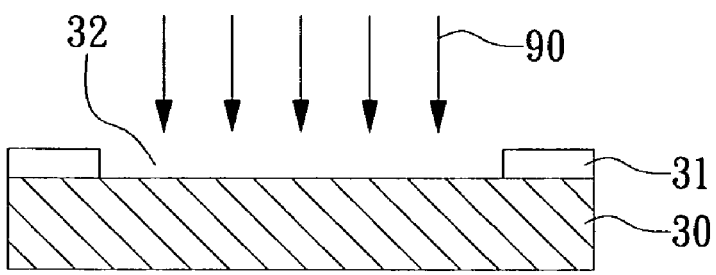
Figure 1C:
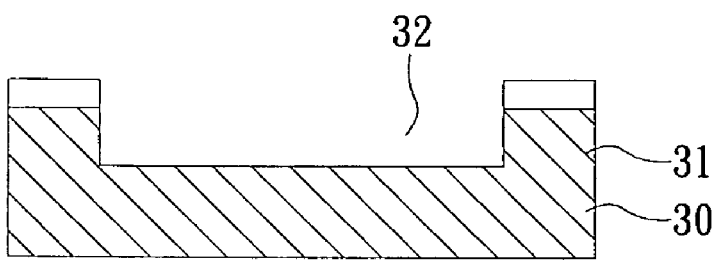
Figure 1D:
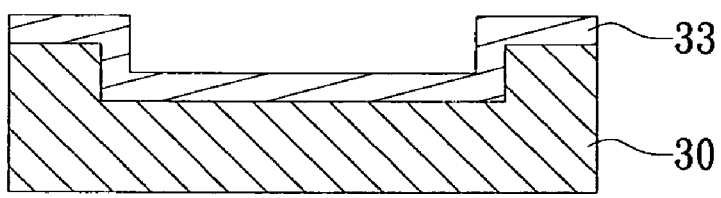
Figure 1E:
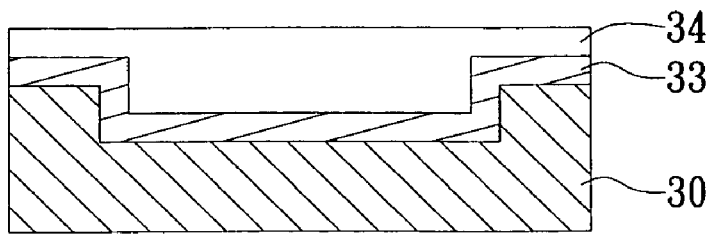
Figure 1F:
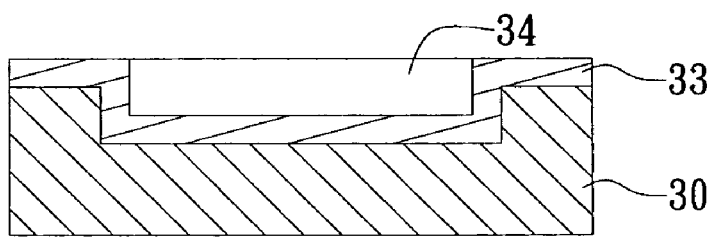
Figure 1G:
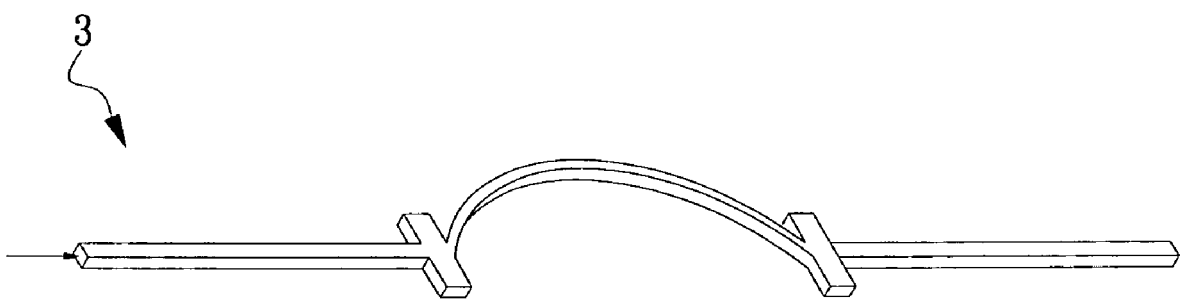
Figure 2D:
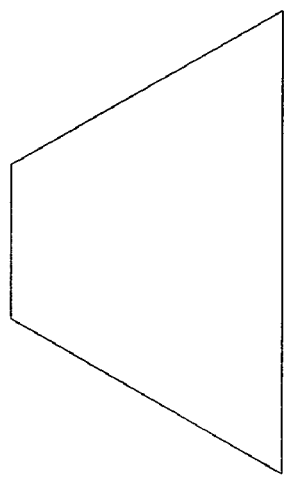
FIG. 2A~FIG. 2D are cross-section of various micro probe made by a fabricating method of the present invention.
Figure 2C:
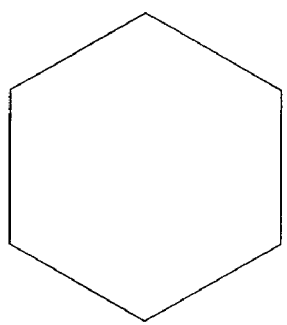
Figure 2B:
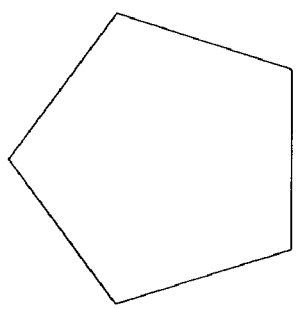
Figure 2A:
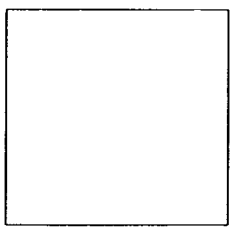

It is intended in the present invention to disclose a method of fabricating a vertical probe head utilizing a LIGA-like process to fabricate a probe head with curve or polygonal profile. Please refer to FIG. 1A to FIG. 1G, which are schematic, diagrams showing successive steps of a method of fabricating a vertical probe head according to a preferred embodiment of the present invention. In FIG. 1G, a three-dimensional view of a vertical probe head is disclosed, which is manufactured using the LIGA-like process of steps shown in FIG. 1A to 1F, whereas the cross sections of the vertical probe head shown in FIG. 1A to FIG. 1F is viewed from a viewing direction indicated by the arrow of FIG. 1G. For clarity, although there is a single micro probe is being formed in the successive steps shown in FIG. 1A to. FIG. 1G, a plurality of micro probe can be manufactured by a batch production manner utilizing the same steps. The manufacturing process starts from the step shown in FIG. 1A as a substrate 30 is provided, which can be made of a silicon or a silicon compound, and then the process proceeds, to the step shown in FIG. 1B. In FIG. 1B, a mask 31 is overlaid, upon the substrate 30 for defining an area 32 utilizing a lithographic process of yellow-luminescence 90, and then the process proceeds to the step shown in FIG. 1C. In FIG. 1C, a portion of the substrate within the defined area 32 is etched away by a means of reactive ion etching (RIE) while controlling the surface characteristics, such as surface roughness, homogeneity, etc., as well as adjusting the slant angle, the arc or the side etching angle defining the profile of the cross section of the etching by controlling the parameter of the RIE, and then the process proceeds to the step shown in FIG. 1D. In FIG. 1D, a seed layer 33 is deposited on the defined area 32, wherein the seed layer can be a conductive metal layer, and then the process proceeds to the step shown in FIG. 1E. In FIG. 1E a metal layer is deposited on the seed layer 33 by a means of electroforming deposition, whereas the metal layer 34 can be made of nickel, gold, silver, copper, nickel alloy, gold alloy, copper alloy and silver alloy, but is not limited thereby, and then the process proceeds to the step shown in FIG. 1F. In FIG. 1F, the metal layer 34 is polished by a polishing means, and then the process proceeds to the step shown in FIG. 1G. In FIG. 1G, the substrate 30 is removed to form a micro probe 3. Please refer to FIG. 2A to FIG. 2D, which are cross-section of various micro probe made by a fabricating method of the present invention. As the micro probe of the present invention is manufactured utilizing a LIGA-like process, the cross-section of the micro probe can be formed in a shape of a polygon such as a quadrangle, a pentagon, a hexagon, and a trapezoid, as seen in FIG. 2A~FIG. 2D, or a geometrical shape with rounded angle or a geometrical shape with arc outline, as seen in FIG. 6A~FIG. 6D, but is not limited thereby. That is, by the method of the present invention, micro probe of various cross sections can be manufactured.

Figure 3A:
FIG. 3A~FIG. 3E are schematic diagrams showing successive steps of a method of fabricating a guide plate adapted for a vertical probe head according to a preferred embodiment of the invention.
Figure 3B:
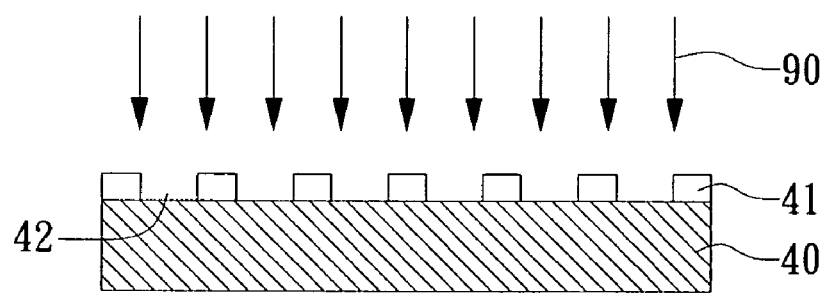
Figure 3C:
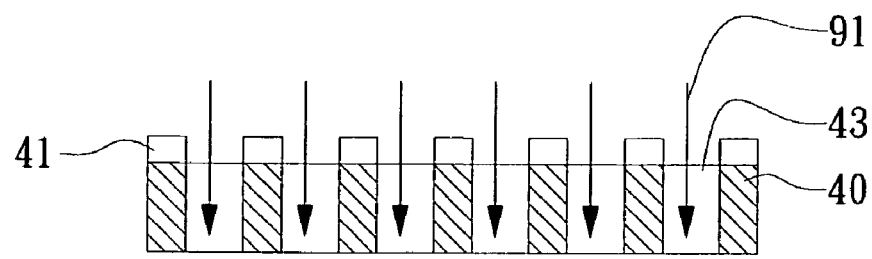

Please refer to FIG. 3A to FIG. 3E, which are schematic diagrams showing successive steps of a method of fabricating a guide plate adapted for a vertical probe head according to a preferred embodiment of the invention. The manufacturing process starts from the step shown in FIG. 3A as a substrate 40 is provided, which can be made of a silicon, a silicon compound or a metal, and then the process proceeds to the step shown in FIG. 3B. In FIG. 3B, a mask 41 is overlaid upon the substrate 40 for defining a through area 42 utilizing a lithographic process of yellow-luminescence 90, and then the process proceeds to the step shown in FIG. 3C. In FIG. 3C, an anisotropic etching is performed upon each defined area 42 for enabling, at least a through hole 43 to be formed therein, and then the process proceeds to the step shown in FIG. 3D. It is noted that, in the preferred embodiment shown in FIG. 3C, the etching direction of the anisotropic etching is directed toward the inside of the substrate 40, whereas, the anisotropic etching can be performed by a means of chemical etching or a means of plasma dry etching. As a guide plate made by a high aspect ratio etching process can achieve a thickness of several centimeters, it not only can have sufficient strength without to be further processed by a backside thinning process as disclosed in T.W. Pat. No. 569017, but also can be formed utilizing a comparatively less complicated process.

Figure 3D:
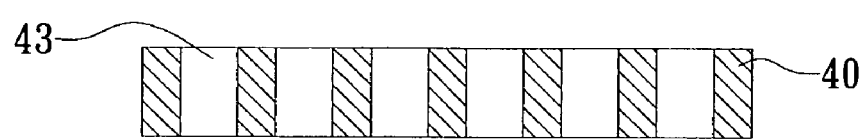
Figure 3E:
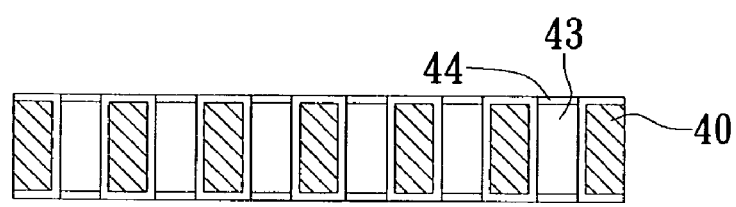
Figure 4B:
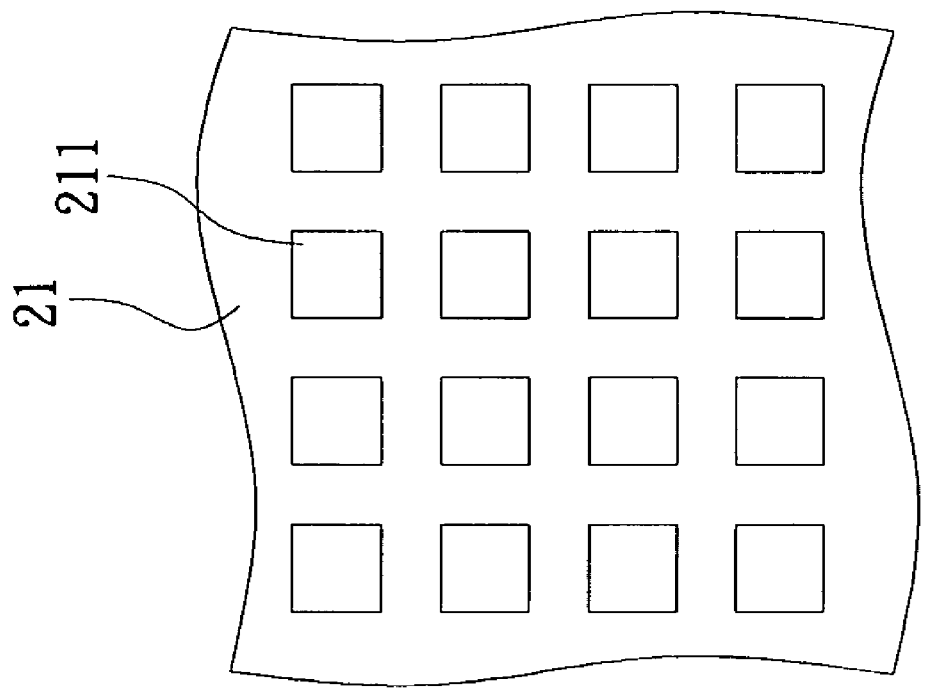
FIG. 4B is a schematic diagram showing a bottom guide plate adapted for a vertical probe head according to a the present invention.
Figure 4A:
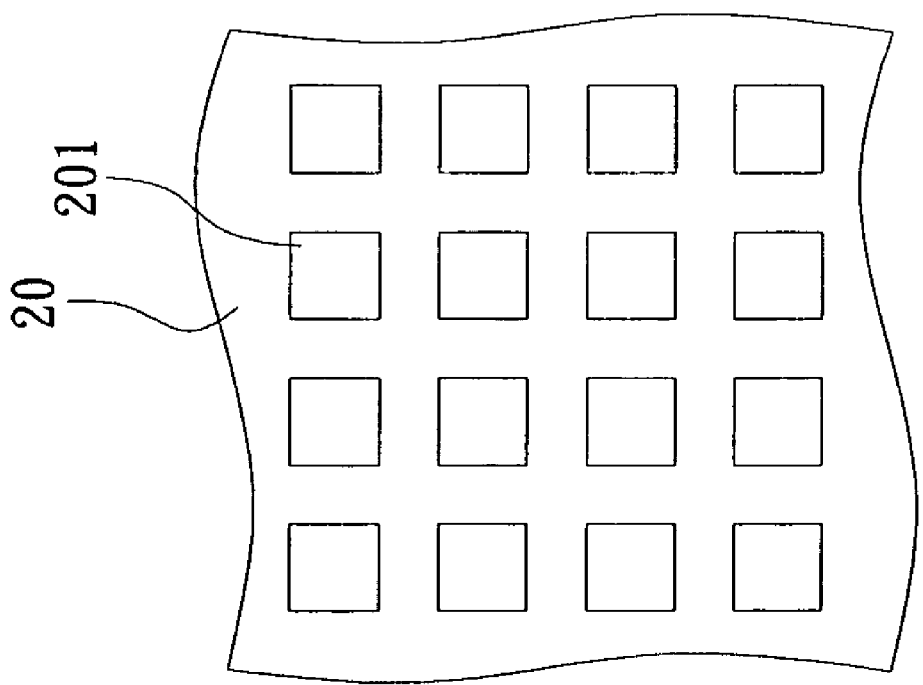
FIG. 4A is a schematic diagram showing a top guide plate adapted for a vertical probe head according to a the present invention.

In FIG. 3D, the mask 41 is removed so as to form a guide plate having at least a through hole 43, and then the process proceeds to the step shown in FIG. 3E. It is noted that the shape of the through hole 43 should match that of the aforesaid micro probe, which can be a round shape, a quadrangle, a pentagon, a hexagon, and so on, as the quadrangle through holes 201, 211 of the top and bottom guide plates 20, 21 shown in FIG. 4A and FIG. 4B, but is not limited thereby. In FIG. 3E, the guide plate is insulated at the area in the vicinity of the through hole 43. The insulation of the guide plate can be achieved by growing a layer of silica thereon or by depositing other dielectric material thereon, such that an insulation film 44 can be formed on the guide plate for preventing interference during test. It is noted that the shape of the through hole 43 can be formed in a shape of a polygon, or a geometrical shape with rounded angle, or a geometrical shape with arc outline. By the methods provided in the present invention, not only the prior-art polygon micro probe and round-shaped through hole can be manufactured, but also it can be used to manufacture a micro probe of different slant angle arc sand side etching angle as required and the guide plated for matching the said micro probe. Consequently, the pitches between micro probes, can be reduced so that more probes can be arranged in an unit area, and in the main time, the detail geometry of each probe can be designed to match the arranging of the probes on a guide plate for achieving optimum performance. In addition, The probe is fabricated by a LIGA-like process combining with the processes of photolithography, etching and electroforming, and so on, so that the probe is equipped with comparatively better precision, strength and reliability and yet can be custom-made for satisfying various demands, and the guide plate having polygonal through holes is manufactured by a non-mechanical process so that thousands of though holes can be formed at once without to be formed one by one.

Figure 5:
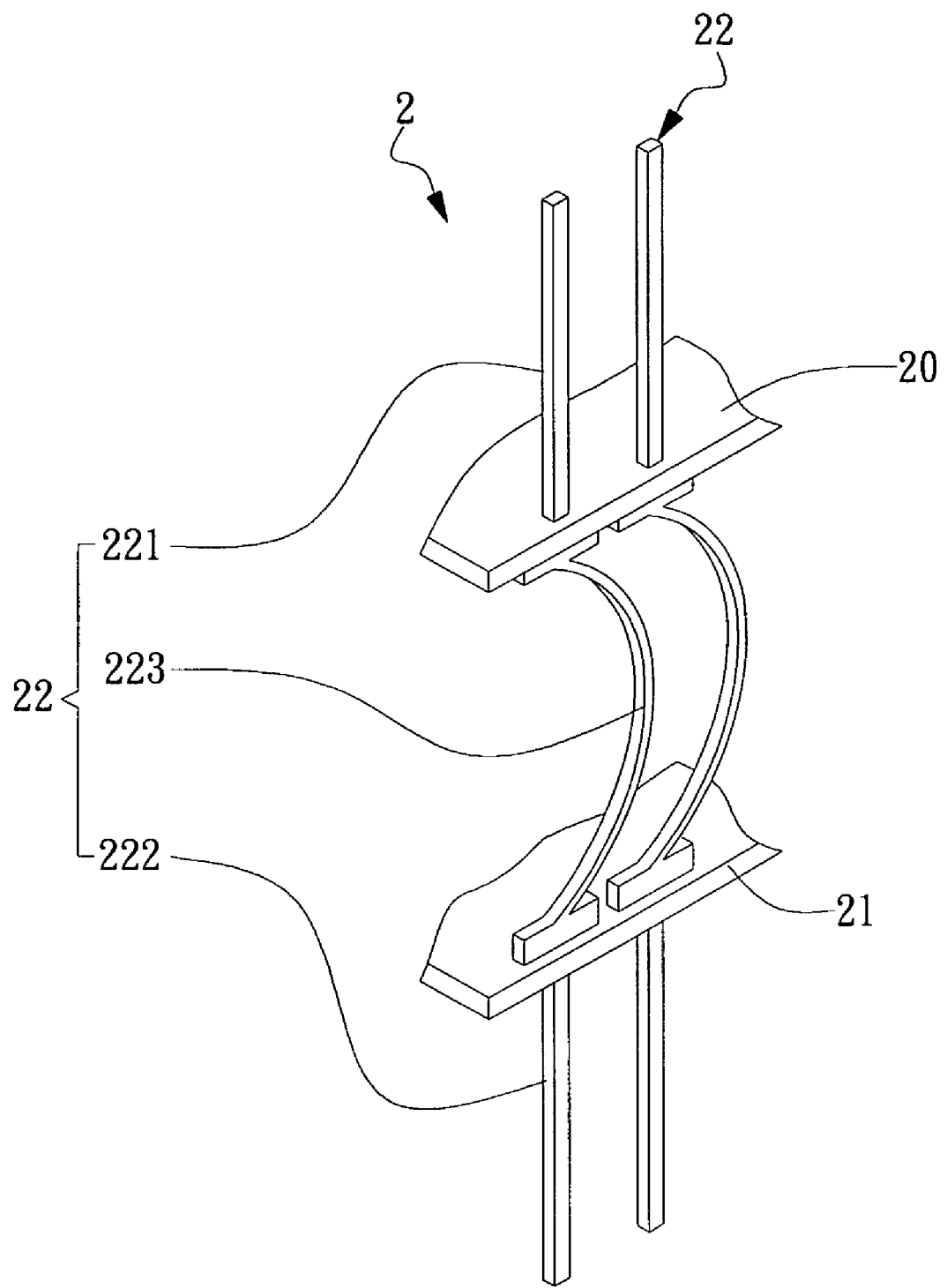
FIG. 5 is a schematic diagram showing a vertical probe head of the present invention.
Figure 6D:
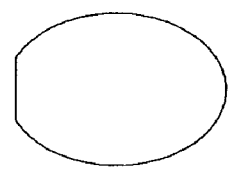
FIG. 6A~FIG. 6D, are cross-section of various micro probe made by a fabricating method according to a preferred embodiment of the invention.
Figure 6C:
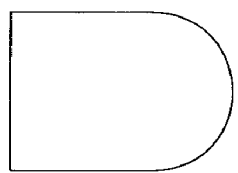
Figure 6B:
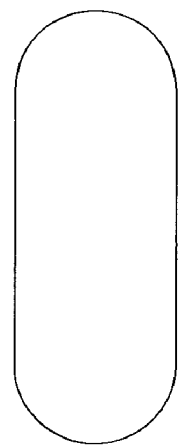
Figure 6A:
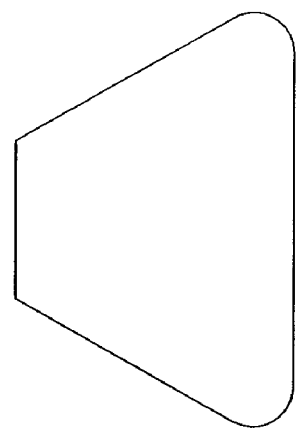

Please refer to FIG. 5, which is a schematic diagram showing a vertical probe head of the present invention. The probe of the vertical probe head 2 of FIG. 5 is manufactured utilizing the process shown in FIG. 1A to FIG. 1G, while the vertical probe head 2 is formed by integrating the probe with the tops and bottom guide plates 20, 21 manufactured by the process shown in FIG. 3A to FIG. 3E. In, the preferred embodiment shown in FIG. 5, the micro probe 22 with quadrangle cross section is fitted into the matching quadrangle through holes of the top and bottom guide plates 20, 21 in respective. It is noted that the top and the bottom guide plates can each be made of a silicon, a silicon compound or a metal. Moreover, the probe manufactured by the process shown in FIG. 1A to FIG. 1G is not necessary having to be fitted to the top and bottom guide plates made by the process shown in FIG. 3A to FIG. 3E, it can be fitted to top and bottom guide plates made by other process.

As seen in FIG. 5, each micro probe 22 is comprised of a first probe 221, a second probe 222, and an elastic member 223 sandwiched between the first and the second probes 221, 222 while connecting thereto. In the preferred embodiment shown in FIG. 5, the cross sections of the first and the second probes 221, 222 are in a quadrangle shape, which are matched to the shape of lithe through holes of the top and bottom plates 20, 21 for enabling the first and the second probes 221, 222 to piece therethrough in respective, such that the top and the bottom guide plates 20, 21 are used for fixing, each micro, probe 22. The elastic member 223 is pre-curved by a curvature and is sandwiched between the first and the second probes 221, 222. It is known to those skilled in the art that the first probe 221 is used to electrically connect to a circuit substrate while the second probe 222 is enabled to contact to a chip to be tested. As the second probe 222 is subjected not a pressure of the chip to be tested and is forced to moved toward the first and the bottom guide plates 20, 21, the elastic member 223 is buckled for buffering the contact between the second probe 222 and the chip to be tested. As the test is ended and the chip is removed, the resilience of the elastic member 223 can restore the second probe 222 back to its initial position.

To sum up the method of the present invention is advantageous as it can be used to manufacture probes and guide plate of various geometrical structures, while enhancing the precision of the probe as well as increasing the number of probe to be arranged in a unit area of the corresponding guide plates, such that the method disclosed in the invention enables the probe head to be fabricated by a cheaper and less complicated process with, more probes to be arranged in a unit area.

While the preferred embodiment of the invention has been set forth for the purpose, of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method of fabricating a vertical probe head, comprising steps of:
    providing a substrate;
    overlaying a mask on the substrate for defining at least an area;
    removing a portion of the substrate within each defined area;
    removing the mask while depositing a seed layer on the substrate;
    depositing a metal layer on the seed layer by a means of electroforming deposition;
    polishing the metal layer; and
    removing the substrate while forming at least a micro probe, comprised of a first probe, a second probe, and an elastic member sandwiched between the first and the second probes while connecting thereto.

2. The method of claim 1, wherein the substrate is made of silicon or silicon compound.

3. The method of claim 1, wherein the removing of the portion of the substrate is performed by a means of reactive ion etching (RIE).

4. The method of claim 1, wherein the metal layer is made of a material selected from the group consisting of nickel, gold, silver, copper, nickel alloy, gold alloy, copper alloy and silver alloy.

5. The method of claim 1, wherein the cross-section of the micro probe is formed in a shape selected from a polygon, a geometrical shape with rounded angle and a geometrical shape with arc outline.

6. A method of fabricating a guide plate adapted for vertical probe heads, comprising steps of:
   providing a substrate;
   overlaying a mask on the substrate for defining at least an area of through holes utilizing a lithographic process;
   performing an anisotropic etching, upon each defined area for enabling at least a through hole to be formed therein; and
   removing the mask so as to form a guide plate having at least a through hole.

7. The method of claim 6, further comprising a step of:
   insulating the guide plate.

8. The method of claim 6, wherein the substrate is made of a material selected from the group consisting of a silicon, a metal, a silicon compound.

9. The method of claim 6, wherein the anisotropic etching is performed by a means selected from the group consisting of a means of chemical etching and a means of plasma dry etching.

10. The method of claim 6, wherein the profile of the through hole is formed in a shape selected from a polygon, a geometrical shape with rounded angle and a geometrical shape with arc outline.

11. A method of fabricating a guide plate adapted for vertical probe heads, comprising steps of:
    providing a substrate;
    overlaying a mask on the substrate for defining at least an area of through holes utilizing a lithographic process;
    performing an anisotropic etching upon each defined area for enabling at least a through hole to be formed therein;
    removing the mask so as to form a guide plate having at least a through hole; and
    insulating the guide plate.

12. The method of claim 11, wherein the substrate is made of a material selected from the group consisting, of a silicon, a metal, a silicon compound.

13. The method of claim 11, wherein the anisotropic etching is performed by a means selected from the group consisting of a means of chemical etching and a means of plasma dry etching.

14. The method of claim 11, wherein the profile of the through hole is formed in a shape selected from a polygon, a geometrical shape with rounded angle and a geometrical shape with arc outline.

15. A method of fabricating a vertical probe head, comprising steps of:
    providing a substrate;
    overlaying a mask on the substrate for defining at least an area;
    removing a portion of the substrate within each defined area;
    removing the mask while depositing a seed layer on the substrate;
    depositing a metal layer on the seed layer by a means of electroforming deposition;
    polishing the metal layer;
    removing the substrate while forming at least a micro probe; and
    combining each micro probe with a guide plate having at least a through hole.

16. The method of claim 15, wherein the profile of the through hole is formed in a shape selected from a polygon, a geometrical shape with rounded angle and a geometrical shape with arc outline.

17. The method of claim 15, wherein the guide plate is made by a method comprising steps of:
    providing a substrate;
    overlaying a mask on the substrate for defining at least an area of through holes utilizing a lithographic process;
    performing an anisotropic etching upon each defined area for enabling at least a through hole to be formed therein; and
    removing the mask so as to form a guide plate having at least a through hole.

18. The method of claim 17, further comprising a step of:
    insulating the guide plate.

19. The method of claim 15, wherein the substrate is made of a material selected from the group consisting of a silicon, a metal, a silicon compound.

20. The method of claim 17, wherein the anisotropic etching is performed by a means selected from the group consisting of a means of chemical etching and a means of plasma dry etching.

* * * * *